United States Patent
Hwang

(10) Patent No.: US 7,560,330 B2
(45) Date of Patent: *Jul. 14, 2009

(54) CMOS IMAGE SENSOR AND METHOD FOR MANUFACTURING THE SAME

(75) Inventor: Joon Hwang, Cheongju-si (KR)

(73) Assignee: Dongbu Electronics, Co., Ltd., Seoul (KR)

( * ) Notice: Subject to any disclaimer, the term of this patent is extended or adjusted under 35 U.S.C. 154(b) by 162 days.

This patent is subject to a terminal disclaimer.

(21) Appl. No.: 11/528,078

(22) Filed: Sep. 26, 2006

(65) Prior Publication Data

US 2007/0069321 A1  Mar. 29, 2007

(30) Foreign Application Priority Data

Sep. 28, 2005  (KR) .................. 10-2005-0090263

(51) Int. Cl.
*H01L 21/8238* (2006.01)

(52) U.S. Cl. ................ 438/200; 438/449; 257/E21.339

(58) Field of Classification Search ........... 438/59, 438/200, 423, 440, 447, 449; 257/E21.339
See application file for complete search history.

(56) References Cited

U.S. PATENT DOCUMENTS

| 5,895,252 A | * | 4/1999 | Lur et al. ............... 438/423 |
| 7,250,647 B2 | * | 7/2007 | Rhodes ................. 257/292 |
| 2003/0127666 A1 | | 7/2003 | Lee | |

FOREIGN PATENT DOCUMENTS

| CN | 1641883 | 7/2005 |
| CN | 1819138 | 8/2006 |
| KR | 10-2003-0007195 | 1/2003 |
| KR | 10-2003-0056071 | 7/2003 |

* cited by examiner

*Primary Examiner*—Chandra Chaudhari
(74) *Attorney, Agent, or Firm*—Saliwanchik, Lloyd & Saliwanchik

(57) ABSTRACT

A CIS and a method of manufacturing the same are provided. The CIS includes a device isolation layer formed on a device isolation region of a substrate of a first conductive type, the substrate including an active region and the device isolation region, the active region including a photodiode region and a transistor region; a high-concentration diffusion region of the first conductive type formed around the device isolation layer; a gate electrode formed on the active region of the substrate with a gate insulation layer interposed therebetween; a low-concentration diffusion region of a second conductive type formed on the photodiode region and spaced a predetermined distance apart from the device isolation layer; and a high-concentration diffusion region of a second conductive type formed on the transistor region.

8 Claims, 5 Drawing Sheets

CMOS IMAGE SENSOR AND METHOD FOR MANUFACTURING THE SAME

RELATED APPLICATION

This application claims the benefit under 35 U.S.C. §119(e), of Korean Patent Application Number 10-2005-0090263 filed Sep. 28, 2005, which is incorporated herein by reference in its entirety.

FIELD OF THE INVENTION

The present invention relates to a CMOS image sensor and a method for manufacturing the same.

BACKGROUND OF THE INVENTION

In general, an image sensor is a device for converting an optical image into an electrical signal. Image sensors are generally classified as charge coupled devices (CCDs) or complementary metal oxide silicon (CMOS) image sensors (CISs).

The CCD has disadvantages, such as a complex driving method and high power consumption. Also, the CCD is manufactured through a multi-step photolithography process; it needs a very complicated manufacturing process. Therefore, the CIS is currently in the spotlight as a next-generation image sensor to resolve the disadvantages of the CCD.

The CIS includes a photodiode and a MOS transistor in a unit pixel to sequentially detect an electric signal in each unit pixel using a switching method for displaying an image.

FIG. 1 is a sectional view of a related art CIS.

In the related art CIS, a device isolation layer 63 is formed on a substrate 61, and then a gate 65 is formed on the substrate 61 with a gate insulation layer 64 interposed therebetween.

Next, a low-concentration N⁻ ion implantation region 69 is formed at one side of the gate 65. Spacers 70 are formed on both sidewalls of the gate 65. Then, a high-concentration N⁺ ion implantation region 72 is formed at the other side of the gate 65.

However, according to the related art CIS, since an N⁻ diffusion region (i.e., a photodiode region) is included in an interface of the device isolation layer 63, a portion of the lattice structure collapsed from the trench etching process performed to form the device isolation layer 63 serves as an interface electro trap and a junction leakage. Therefore, the related art CIS has a problem of weak to low illumination.

Additionally, according to the related art CIS, the device isolation 63 between pixels may not appropriately function and cause a problem of crosstalk where light of one pixel is transmitted into other pixels. Especially, according to the related art CIS, since the depth of a trench in the device isolation layer 63 is within 0.5 μm, electrons generated from the light of a long wavelength (especially, red) may not be efficiently isolated.

SUMMARY OF THE INVENTION

Accordingly, the present invention is directed to a CMOS image sensor and a method for manufacturing the same that addresses and/or substantially obviates one or more problems, limitations, and/or disadvantages of the related art.

An object of the present invention is to provide a CIS without a junction leakage or an interface electron trap by preventing a lattice defect region from being converted into a photodiode region, the lattice defect region being generated when a lattice structure collapses due to an etching damage in the interface of a device isolation layer, and a method for manufacturing the same.

Another object of the present invention is to provide a CIS that can prevent or substantially reduce crosstalk caused by light of one pixel transmitting into other pixels, by effectively performing the separation for device isolation between pixels.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, there is provided a CIS including a device isolation layer formed on a device isolation region of a substrate of a first conductive type, the substrate including an active region and the device isolation region, the active region including a photodiode region and a transistor region; a high-concentration diffusion region of the first conductive type formed around the device isolation layer; a gate electrode formed on the active region of the substrate with a gate insulation layer interposed therebetween; a low-concentration diffusion region of a second conductive type formed on the photodiode region and spaced a predetermined distance apart from the device isolation layer; and a high-concentration diffusion region of the second conductive type formed on the transistor region.

In another aspect of the present invention, there is provided a method for manufacturing a CIS including forming a device isolation layer on a device isolation region of a substrate of a first conductive type and a high-concentration diffusion region of the first conductive type around the device isolation layer, the substrate including an active region and the device isolation region, the active region including a photodiode region and a transistor region; forming a gate electrode on the active region of the substrate with a gate insulation layer interposed therebetween; forming a low-concentration diffusion region of a second conductive type on the photodiode region spaced a predetermined distance apart from the device isolation layer; and forming a high-concentration diffusion region of the second conductive type on the transistor region.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings.

Figure 1:
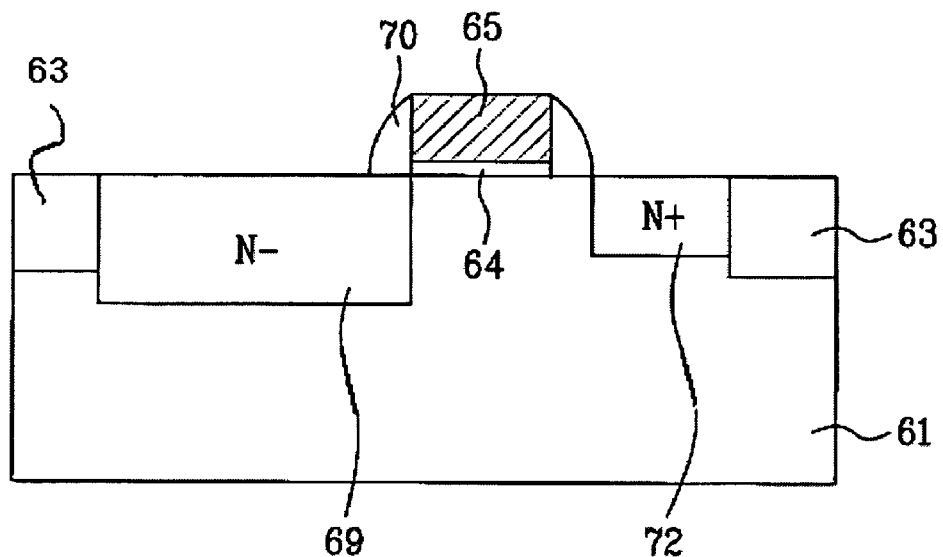
FIG. 1 is a sectional view of a related art CIS.
Figure 2:
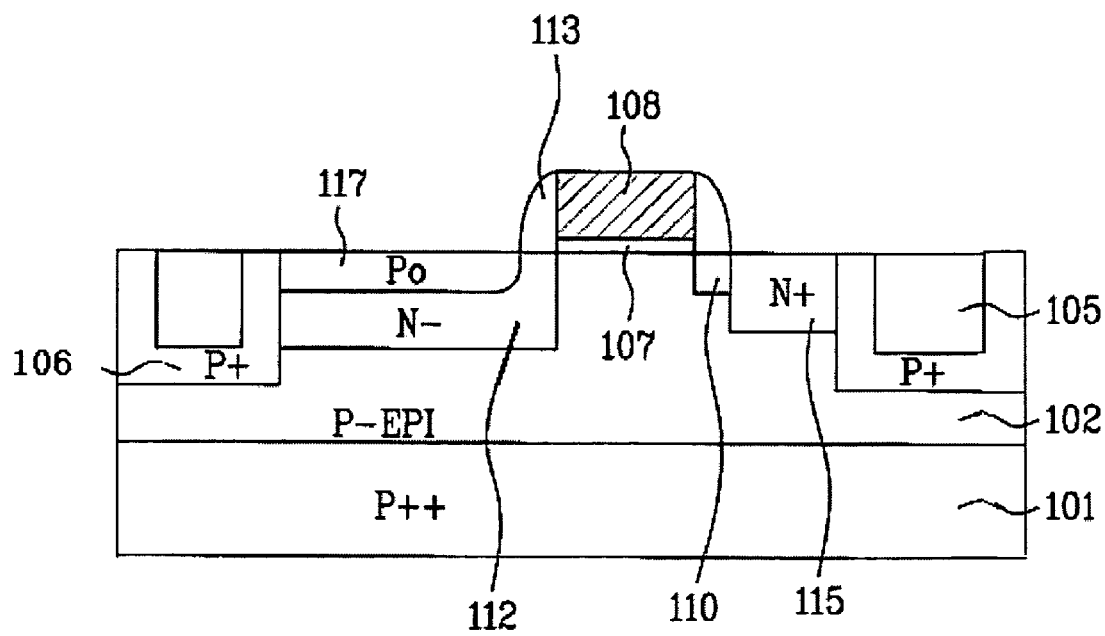
FIG. 2 is a sectional view of a CIS according to an embodiment of the present invention.

FIG. 2 is a sectional view of a complementary metal oxide silicon image sensor (CIS) according to an embodiment of the present invention.

Referring to FIG. 2, in the CIS, a $p^{--}$ epi layer 102 can be formed on a $p^{++}$ conductive semiconductor substrate 101 having an active region and a device isolation region. The active region includes a photodiode region and a transistor region.

The active region on the semiconductor substrate 101 can be defined by a device isolation layer 105 and a high-concentration $p^+$ diffusion region 106 surrounding the device isolation layer 105. In a specific embodiment, the $p^+$ diffusion region 106 can be formed with a junction depth of 1 to 2 μm.

Here, the high-concentration $p^+$ diffusion region 106 surrounds the device isolation layer 105 except for the top surface, and can be formed deeper into the substrate than the device isolation layer 105. Therefore, an isolation effect for device separation between pixels is maximized and crosstalk can be prevented.

Additionally, a lattice defect region in the interface of the device isolation layer 105 prevents the high-concentration $p^+$ diffusion region 106 from being converted into a photodiode region. Therefore, a junction leakage or an interface electron trap can be prevented such that the sensitivity of an image sensor improves.

A gate electrode 108 can be formed on the active region of the semiconductor substrate 101 with a gate insulation layer 107 interposed therebetween.

A low-concentration $n^-$ diffusion region 112 can be formed on the photodiode region at one side of the gate electrode 108, and is spaced a predetermined distance apart from A low-concentration $n^-$ diffusion region 112 can be formed on the photodiode region at one side of the gate electrode 108, and is spaced a predetermined distance apart from the device isolation layer 105.

At this point, the low-concentration $n^-$ diffusion region 112 is spaced apart from the device isolation layer 105 by a thickness of the high-concentration $p^+$ diffusion region 106. Therefore, an isolation effect for device separation between pixels is maximized and crosstalk can be prevented.

A low-concentration $n^-$ diffusion region 110 can be formed on the transistor region at the other side of the gate electrode. Insulation layer sidewalls 113 can be formed on both sides surfaces of the gate electrode 108. A high-concentration $n^+$ diffusion region 115 can also be formed on the transistor region. In a further embodiment, a $P^0$ diffusion region 117 can be formed near the surface of the photodiode region having the low-concentration $n^-$ diffusion region 112.

FIGS. 3 to 10 are sectional views illustrating a method for manufacturing a CIS according to an embodiment of the present invention.

Hereinafter, the formation order of each component should not be construed as being limited to the embodiments set forth herein. The formation order may be interchangeable between components.

Figure 3:
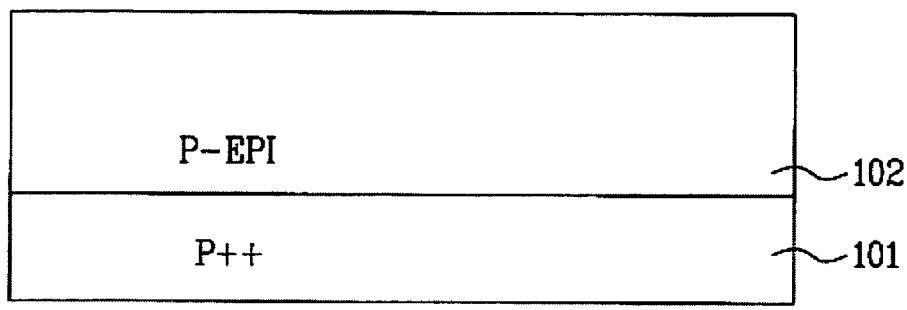
FIGS. 3 to 10 are sectional views illustrating a method for manufacturing a CIS according to an embodiment of the present invention.

Referring to FIG. 3, a low-concentration first conductive ($P^-$) epi layer 102 can be formed on a semiconductor substrate 101 using an epitaxial process. In a specific embodiment, the semiconductor substrate 101 can be a high-concentration first conductive ($P^{++}$) single crystal silicon.

Here, the epi layer 102 can form a depletion region in a photodiode largely and deeply such that the capability for collecting photo charge in a low-voltage photodiode increases and photo sensitivity improves.

In another embodiment, the semiconductor substrate 101 may be an n-type substrate having a p-type epi layer thereon.

Figure 4:
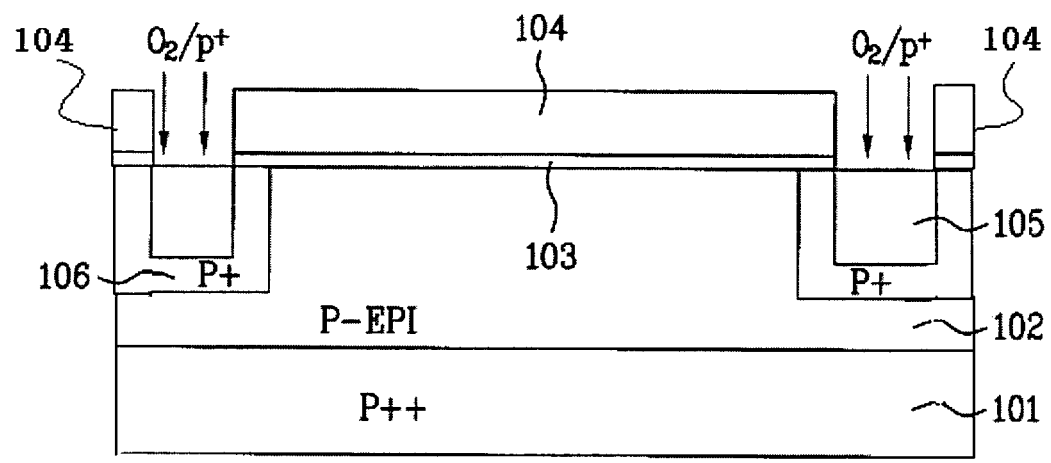

Next, as illustrated in FIG. 4, a pad oxide layer 103 can be formed on the semiconductor substrate 101 having the epi layer 102. A first photosensitive film 104 can be formed on the pad oxide layer 103.

Next, the first photosensitive film 104 can be selectively patterned to define a device isolation region using an exposure and development process.

Here, a region where the first photosensitive film 104 is uncovered becomes a device isolation region. A region where the first photosensitive film 104 is covered becomes an active region.

Using the patterned first photosensitive film 104 as a mask, oxygen ($O_2$) ions can be implanted into the device isolation region of the semiconductor substrate 101. Then, $p^+$ impurity ions can be implanted at high concentration into the device isolation region having the oxygen ions. In one embodiment, the $p^+$ impurity ions can be $B^+$ ions.

Next, an annealing process can be performed on the semiconductor substrate 101 to diffuse the oxygen ions and the high-concentration $p^+$ impurity ions such that a device isolation layer 105 is formed on the device isolation region of the semiconductor substrate 101 and a high-concentration $p^+$ diffusion region 106 is formed around the device isolation layer 105 simultaneously.

Here, the high-concentration $p^+$ impurity ions used in the high-concentration $p^+$ diffusion region 106 have a better diffusivity than the oxygen ions implanted to form the device isolation layer 105. Thus, the high-concentration $p^+$ impurity ions are more widely diffused and surround the device isolation layer 105.

In a specific embodiment, the high-concentration $p^+$ diffusion region 106 is formed with a junction depth of 1 to 2 μm deeper than the device isolation layer 105.

Accordingly, the high-concentration $p^+$ diffusion region 106 can surround the device isolation layer 105 except for the top surface, and can be formed deeper into the substrate than the device isolation layer 105. Therefore, an isolation effect for device separation between pixels is maximized and crosstalk can be prevented.

Additionally, a lattice defect region in the interface of the device isolation layer 105 prevents the high-concentration $p^+$ diffusion region 106 from being converted into a photodiode region. Therefore, a junction leakage or an interface electron trap can be prevented such that sensitivity of an image sensor improves.

Figure 5:
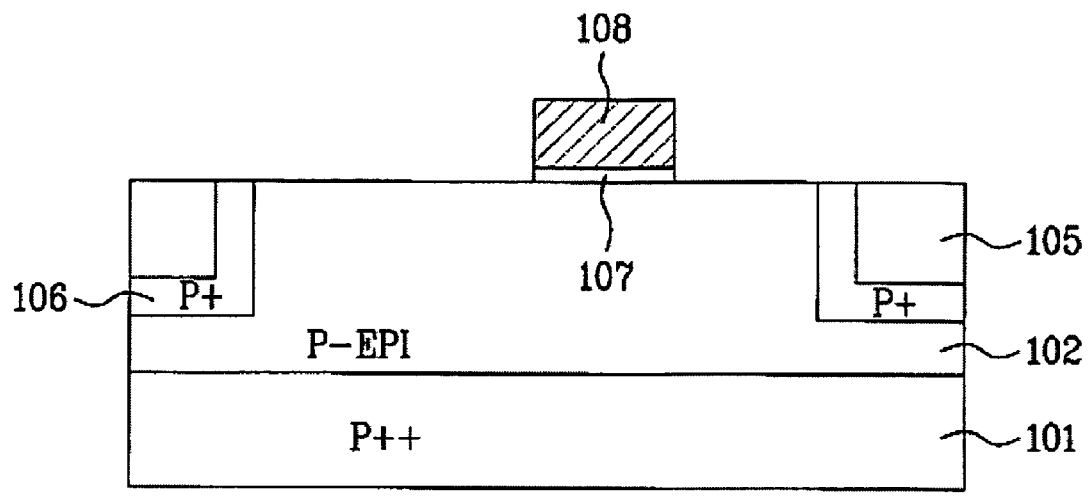

Next, as illustrated in FIG. 5, the first photosensitive film 104 and the pad oxide layer 103 are removed. A gate insulation layer 107 and a conductive layer (e.g., a high-concentration polycrystal silicon layer) can be sequentially deposited on an entire surface of the epi layer 102 having the device isolation layer 105.

In one embodiment, the gate insulation layer 107 can be formed using a thermal oxide process or a chemical vapor deposition (CVD) method.

The conductive layer and the gate insulation layer 107 can then be selectively removed to form a gate electrode 108.

Figure 6:
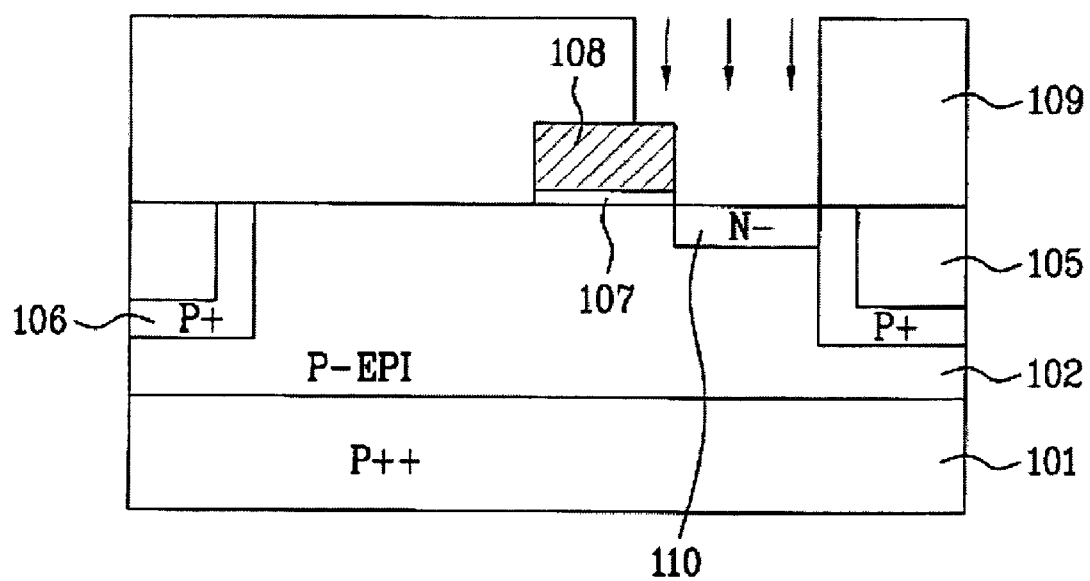

As illustrated in FIG. 6, a second photosensitive film 109 can be formed on an entire surface of the semiconductor substrate 101 having the gate electrode 108. The second photosensitive film 109 can cover each photodiode region and can be patterned to expose source/drain regions for each transistor using an exposure and development process.

Using the patterned second photosensitive film 109 as a mask, n⁻ impurity ions can be implanted at low concentration into the exposed source/drain regions to form an n⁻ diffusion region 110.

In an embodiment, the n⁻ diffusion region 110 can be considered as optional and does not need to be formed.

Figure 7:
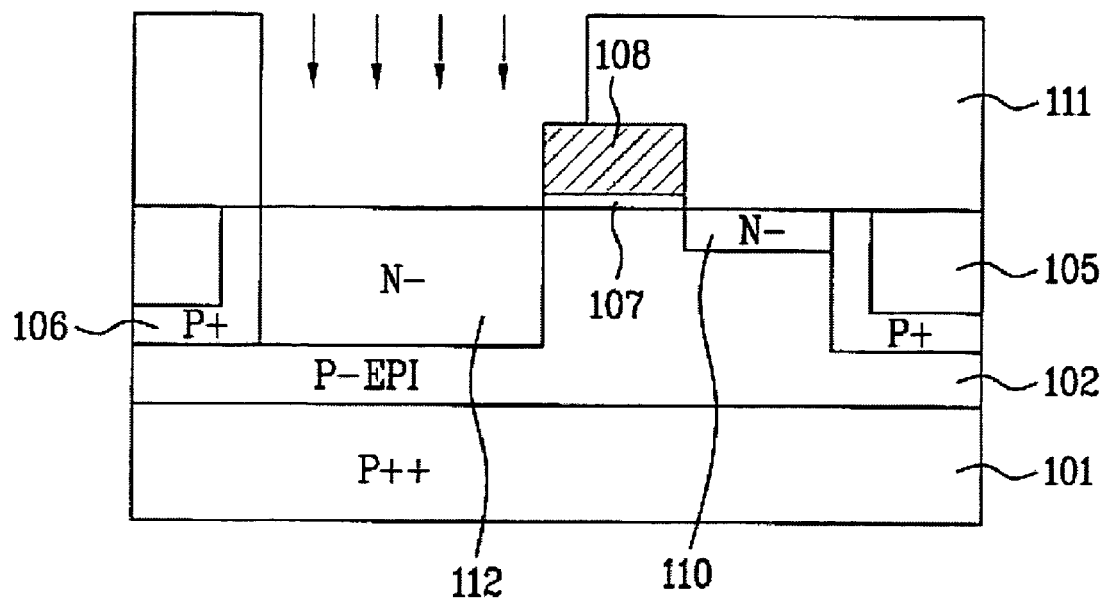

As illustrated in FIG. 7, after removing the second photosensitive film 109, a third photosensitive film 111 can be formed on an entire surface of the semiconductor substrate 101, and can be patterned to expose each photodiode region using an exposure and development process.

Using the patterned third photosensitive film 111 as a mask, n⁻ impurity ions can be implanted at low concentration into the epi layer 102 to form an n⁻ diffusion region 112.

In one embodiment, the impurity ion implantation for forming the n⁻ diffusion region 112 can be performed using higher energy than the n⁻ diffusion region 110 in the source/drain regions. Thus, the n⁻ diffusion region 112 can be formed deeper into the substrate than the n⁻ diffusion region 110.

Then, after removing the patterned third photosensitive film 111 and depositing an insulation layer on an entire surface of the semiconductor substrate 101, an etch back process can be performed to form sidewall insulation layers 113 on the both sides of the gate electrode 108.

Figure 8:
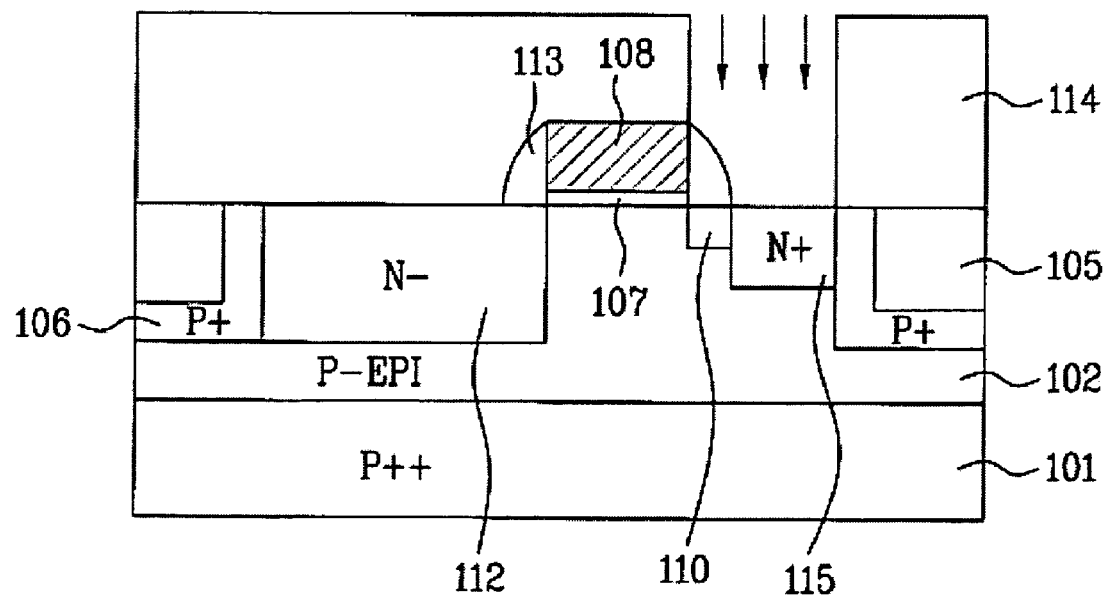

Next, as illustrated in FIG. 8, a fourth photosensitive film 114 can be formed on an entire surface of the semiconductor substrate 101 having the sidewall insulation layers 113. The fourth photosensitive film 114 can cover each photodiode region and can be patterned to expose source/drain regions for each transistor using an exposure and development process.

Next, using the fourth photosensitive film 114 as a mask, n⁺ impurity ions can be implanted at high concentration into the exposed source/drain regions to form the high-concentration n⁺ diffusion region 115.

Figure 9:
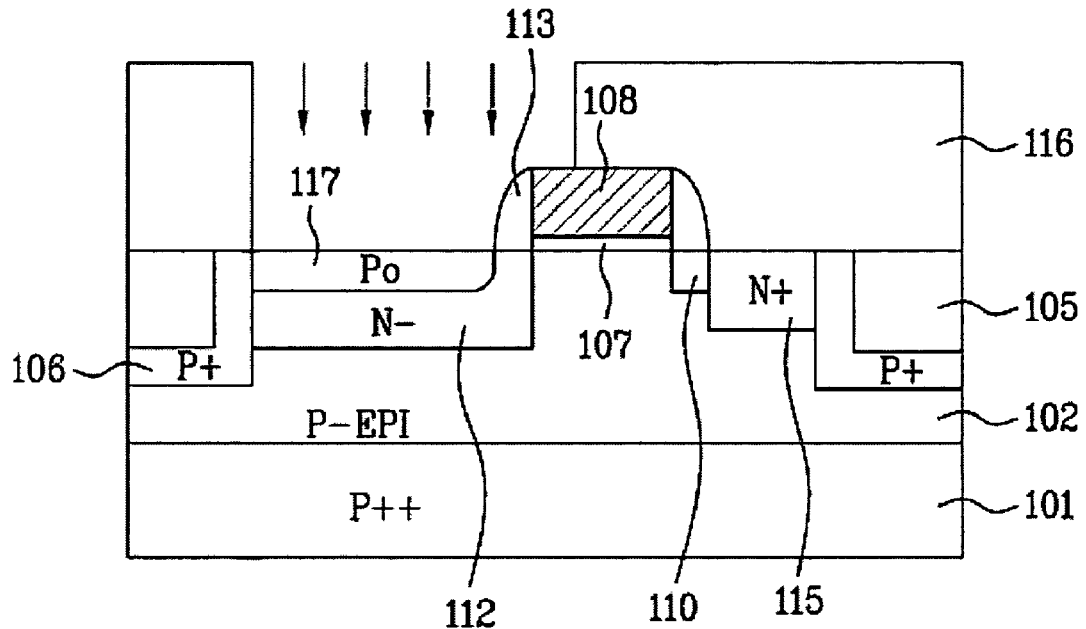

Next, as illustrated in FIG. 9, after removing the fourth photosensitive film 114 a fifth photosensitive film 116 can be formed on an entire surface of the semiconductor substrate 101. The fifth photosensitive film 116 can be patterned to expose each photodiode region using an exposure and development process.

Using the patterned fifth photosensitive film 116 as a mask, p⁰ impurity ions can be implanted into the epi layer 102 having the low-concentration n⁻ diffusion region 112 to form a p⁰ diffusion region 117 in the epi layer 102.

Figure 10:
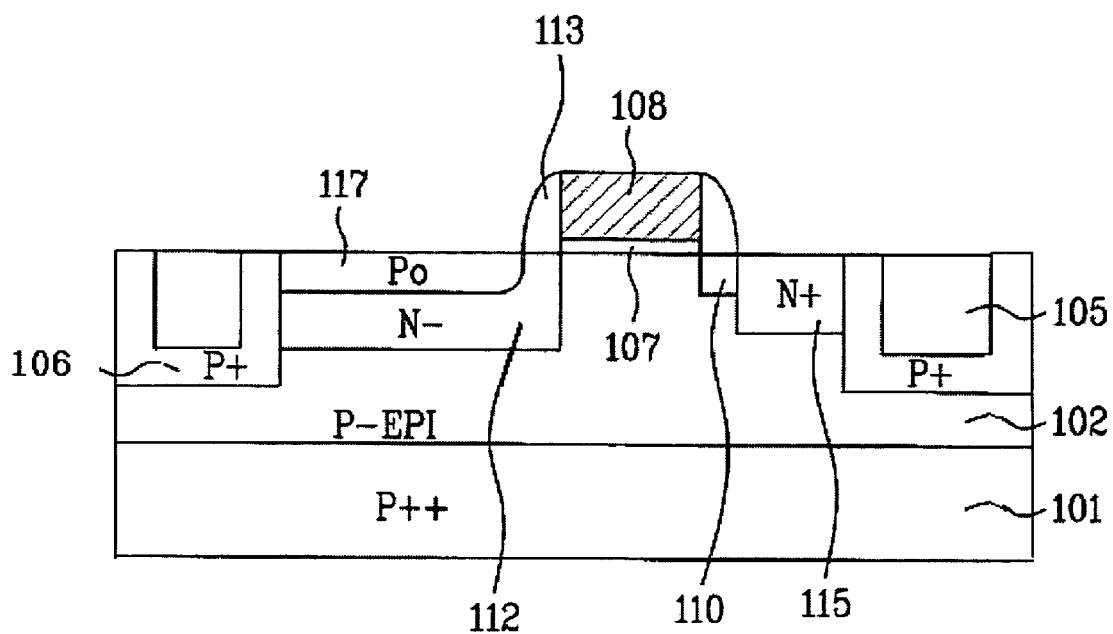

As illustrated in FIG. 10, after removing the fifth photosensitive film 116, a thermal treatment process can be performed on the semiconductor substrate 101 to diffuse each impurity diffusion region.

Next, although processes are not shown in the drawings, after forming a plurality of metal lines in an interlayer insulation layer on the result, a color filter layer and a microlens can be formed to complete an image sensor.

According to the present invention, the CIS and a method for manufacturing the same have following effects.

After implanting oxygen ions, a device isolation layer is formed and then a p⁺ diffusion region is formed around the device isolation layer. Therefore, an isolation effect for device separation between pixels is maximized and crosstalk can be prevented.

Additionally, since the p⁺ diffusion region is formed around the device isolation layer, a lattice defect region in the interface of the device isolation layer prevents the high-concentration p⁺ diffusion region 106 from being converted to a photodiode region. Therefore, a junction leakage or an interface electron trap can be prevented such that the sensitivity of an image sensor improves.

It will be apparent to those skilled in the art that various modifications and variations can be made in the present invention. Thus, it is intended that the present invention covers the modifications and variations of this invention provided they come within the scope of the appended claims and their equivalents.

I claim:

1. A method for manufacturing a CIS (complementary metal oxide silicon image sensor), the method comprising:
    forming a device isolation layer on a device isolation region of a substrate of a first conductive type;
    forming a high-concentration first conductive type diffusion region around the device isolation layer;
    forming a gate electrode on an active region of the substrate with a gate insulation layer interposed therebetween;
    forming a low-concentration second conductive type diffusion region on a photodiode region of the active region spaced a predetermined distance apart from the device isolation layer; and
    forming a high-concentration second conductive type diffusion region on a transistor region of the active region,
    wherein the forming of the device isolation layer and the forming of the high-concentration first conductive type diffusion region comprises:
    implanting oxygen ions into the device isolation region;
    implanting high-concentration first conductive impurity ions into the device isolation region after implanting the oxygen ions; and
    performing an annealing process to the substrate into which the oxygen ions and the high concentration first conductive impurity ions have been implanted.

2. The method according to claim 1, wherein the high-concentration first conductive type diffusion region isolates the device isolation layer from the low-concentration second conductive type diffusion region.

3. The method according to claim 1, wherein the high-concentration first conductive type diffusion region surrounds the device isolation layer except for a top surface of the device isolation layer.

4. The method according to claim 1, wherein the forming of the device isolation layer and the high-concentration first conductive type diffusion region comprises:
    forming a pad oxide layer on the substrate;
    coating a photosensitive film on the pad oxide layer and patterning the pad oxide to expose the device isolation region;
    implanting the oxygen ions and then the high-concentration first conductive impurity ions into the device isolation region using the patterned photosensitive film as a mask; and
    performing the annealing process to the substrate into which the oxygen ions and the high-concentration first conductive impurity ions have been implanted.

5. The method according to claim 1, wherein the high-concentration first conductive type diffusion region is formed deeper into the substrate than the device isolation layer.

6. The method according to claim 1, wherein the high-concentration first conductive type diffusion region is formed with a junction depth of 1 to 2 μm.

7. The method according to claim 1, wherein the high-concentration first conductive type diffusion region is formed by implanting B⁺ ions into the device isolation region of the substrate.

8. The method according to claim 1, further comprising forming a low-concentration second conductive type diffusion region on the transistor region of the substrate.

* * * * *

UNITED STATES PATENT AND TRADEMARK OFFICE
CERTIFICATE OF CORRECTION

| | | |
|---|---|---|
| PATENT NO. | : 7,560,330 B2 | |
| APPLICATION NO. | : 11/528078 | |
| DATED | : July 14, 2009 | |
| INVENTOR(S) | : Joon Hwang | |

It is certified that error appears in the above-identified patent and that said Letters Patent is hereby corrected as shown below:

<u>On the Title Page, Item (56) Foreign Patent Documents</u>
Third Reference, "10-2003-0007195" should read --10-2003-0001795--.

Signed and Sealed this
Eighth Day of February, 2011

David J. Kappos
*Director of the United States Patent and Trademark Office*